(12) United States Patent
Kwon

(10) Patent No.: US 8,097,540 B2
(45) Date of Patent: Jan. 17, 2012

(54) METHOD OF OPENING PAD IN SEMICONDUCTOR DEVICE

(75) Inventor: Dae-Heok Kwon, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 610 days.

(21) Appl. No.: 12/330,635

(22) Filed: Dec. 9, 2008

(65) Prior Publication Data

US 2009/0152687 A1    Jun. 18, 2009

(30) Foreign Application Priority Data

Dec. 12, 2007 (KR) .................... 10-2007-0128635

(51) Int. Cl.
*H01L 21/302* (2006.01)
*H01L 21/461* (2006.01)

(52) U.S. Cl. . 438/707; 438/619; 438/637; 257/E21.214; 257/734

(58) Field of Classification Search ........... 257/E21.214, 257/E29.006, 632, 734, 758, 774; 438/280, 438/619, 629, 637–640, 667, 668, 672, 675, 438/700, 701, 707, 713, 978

See application file for complete search history.

(56) References Cited

U.S. PATENT DOCUMENTS

| | | | | |
|---|---|---|---|---|
| 5,629,236 A | * | 5/1997 | Wada et al. | 438/607 |
| 5,668,410 A | * | 9/1997 | Yamamoto | 257/737 |
| 6,389,686 B2 | * | 5/2002 | Takahashi et al. | 29/830 |
| 7,323,814 B2 | * | 1/2008 | Miyazaki et al. | 313/495 |
| 7,419,770 B2 | * | 9/2008 | Ikeda et al. | 430/321 |
| 2007/0023870 A1 | * | 2/2007 | Dubois et al. | 257/642 |

FOREIGN PATENT DOCUMENTS

KR    10-1998-081177    11/1998
KR    10-2002-0000050    1/2002

* cited by examiner

*Primary Examiner* — Chris Chu
(74) *Attorney, Agent, or Firm* — Sherr & Vaughn, PLLC

(57) ABSTRACT

A method of opening a pad in a semiconductor device. A protective film on a pad may be etched with a pad opening pattern as a mask. Dielectric heating may be performed on the pad opened by etching the protective film. Organic material containing C and F groups on the pad may be removed by heating with molecular vibration and/or microwaves, which may substantially prevent and/or minimize corrosion.

20 Claims, 4 Drawing Sheets

METHOD OF OPENING PAD IN SEMICONDUCTOR DEVICE

The present application claims priority under 35 U.S.C. 119 to Korean Patent Application No. 10-2007-0128635 (filed on Dec. 12, 2007), which is hereby incorporated by reference in its entirety.

BACKGROUND

Relatively highly integrated semiconductor devices and/or relatively complex value-added devices may require processes for determining characteristics of the devices. For example, a pad opening process at final stages of wafer processing may be important. A pad may be connected to a wire during wire bonding in an assembly process for forming a semiconductor chip. The semiconductor device may transmit and/or receive signals through the pad. A pad opening process may be important because a product may not be commercially viable and have to be discarded due to foreign substances on the pad or visual defects, regardless of the device characteristics.

Figure 1A:
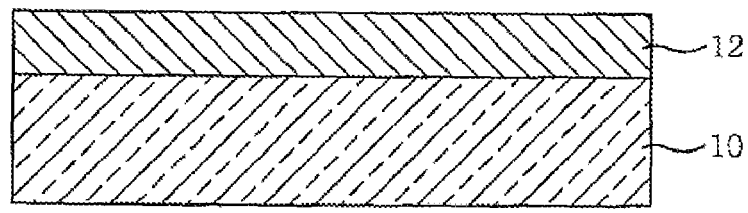
Figure 1B:
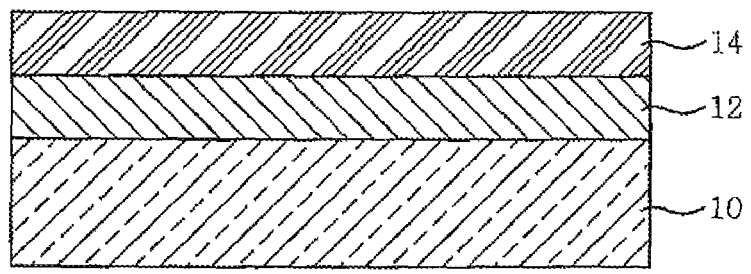
Figure 1C:
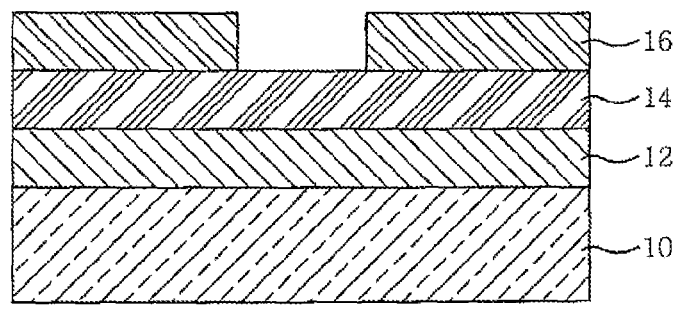
Figure 1D:
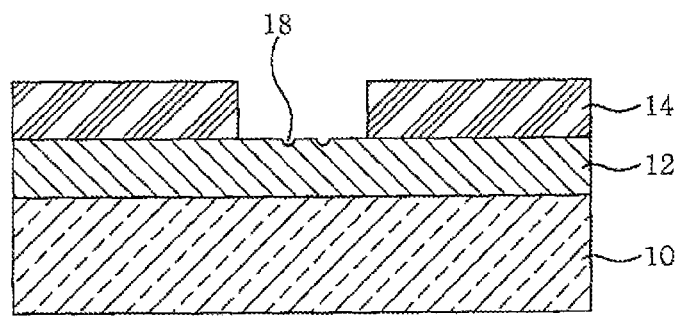

FIGS. 1A to 1D are sectional views illustrating a method of opening a pad in a semiconductor device. As illustrated in FIG. 1A, a pad 12 made of a metal film may formed on and/or over a semiconductor substrate 10. As illustrated in FIG. 1B, a protective film 14 may be formed on and/or over substrate 10 and/or pad 12. Protective film 14 may include silicon nitride (SiN). As illustrated in FIG. 1C, a photosensitive film (e.g. a photoresist) may be used as a mask material to form an opening in pad 12. A photosensitive film may be coated on and/or over protective film 14 and patterned by exposure and development methods to form pad opening pattern 16. Accordingly, a pad opening pattern 16 is formed to partially expose protective film 14. As illustrated in FIG. 1D, exposed protective film 14 may be etched using the pad opening pattern 16 as a mask to open pad 12. Pad opening pattern 16 may then be removed.

An example of a visual defect that may remain on the pad of the semiconductor device is pit-like pad corrosion 18 illustrated in FIG. 1D. Such a pad corrosion 18 may adversely affect qualitative characteristics of a packaging process. At least for this reason, it may be necessary and/or desirable to manage and/or limit the degree of pad corrosion to a predetermined limit. There are different reasons for pad corrosion. For example, when etching protective film 14 on pad 12, $C_xF_y$-based gas may be used. Then, an organic polymer containing C and F groups may consequently remain on the surface of the pad 12 and reacts with moisture ($H_2O$) in a subsequent process. This reaction may cause corrosion 18. Further, C and F groups may exist during dry etching. Similarly, C and F groups may react with moisture in a subsequent process and this reaction may cause corrosion 18. If pad corrosion occurs, resistance may become relatively high. Relatively high resistance may cause deterioration of the characteristics of the semiconductor device.

SUMMARY

Embodiments relate to a method of opening a pad in a semiconductor device. In embodiments, a method of opening a pad in a semiconductor device may be performed that minimizes and/or substantially prevents a pad from corroding in a pad opening process. In embodiments, a method of opening a pad in a semiconductor device may substantially remove an organic polymer containing C and F groups on a pad through heating with molecular vibration, thereby substantially preventing a pad from corroding.

In embodiments, a method of opening a pad in a semiconductor device includes at least one of the following: Etching a protective film on a pad with a pad opening pattern as a mask to open the pad. Performing dielectric heating on the pad opened by etching the protective film.

In embodiments, dielectric heating may use microwaves. Dielectric heating may be directly applied to the molecules of an organic material containing C and F groups. Dielectric heating may heat and resolve the organic material, such that the organic material is removed in the form of $CO_2$, $H_2O$, HF, and/or $C_xF_y$ gas.

In embodiments, an organic material containing C and F groups on the pad may be removed by heating with molecular vibration, which may substantially prevent and/or minimize corrosion of the pad.

DRAWINGS

FIGS. 1A to 1D are sectional views illustrating a method of opening a pad in a semiconductor device.

Example FIGS. 2A to 2E are sectional views illustrating a method of opening a pad in a semiconductor device, in accordance with embodiments.

DESCRIPTION

In embodiments, a pad opening process in a semiconductor device may remove an organic polymer containing C and F groups after a protective film is etched by microwave dielectric heating. Accordingly, residues after etching may be substantially removed. Microwave dielectric heating is a phenomenon in which a dipole is generated in a dielectric and rotated by a high-frequency electric field. Heat is generated by friction between molecules. Accordingly, microwave dielectric heating may be directly applied to the molecules of a residual organic material containing C and F groups after etching. Microwave dielectric heating may heat and resolve organic material, such that the organic material is removed in the form of $CO_2$, $H_2O$, HF, and $C_xF_y$ gas. In embodiments, microwave dielectric heating may have a relatively high heating efficiency on organic material containing carbon atoms having a relatively high dielectric constant. Accordingly, potentially negative effects of an organic polymer containing C and F groups may be mitigated, in embodiments. Accordingly, in embodiments, an organic polymer may be efficiently removed.

Example FIGS. 2A to 2E are sectional views illustrating a method of opening a pad in a semiconductor device, in accordance with embodiments. As illustrated in example FIG. 2A, pad 102 made of a metal film may be formed on and/or over a semiconductor substrate 100. Pad 102 may formed, for example, by depositing aluminum (Al), in accordance with embodiments.

Figure 2A:
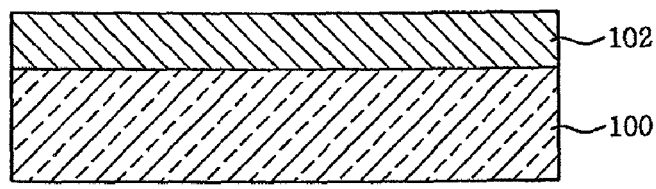
Figure 2B:
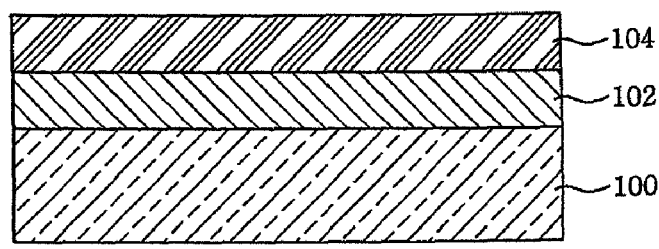

As illustrated in example FIG. 2B, a protective film 104 may be formed on and/or over a surface of the substrate 100 to cover pad 102. Protective film 104 may include at least one of silicon nitride (SiN), silicon oxide ($SiO_2$), silicon oxynitride (SiON), and/or similar material. Protective film 104 may include a single layer or multiple layers.

Figure 2C:
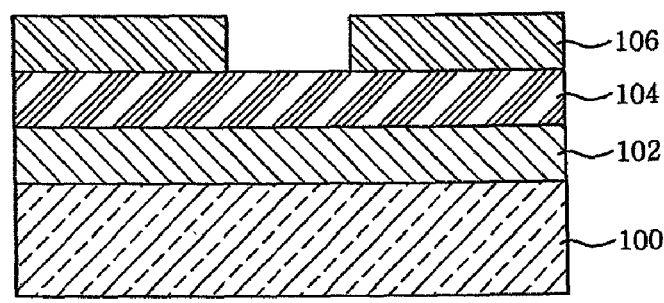

As illustrated in example FIG. 2C, a photosensitive film (e,g, a photoresist) may be formed (e.g. coated) on and/or over protective film 104, in accordance with embodiments. In embodiments, the photosensitive film may be used as a mask material for opening pad 102 is coated on the protective film 104 and patterned by exposure and development. A pad opening pattern 106 may be formed through an exposure and development process that exposes protective film 104, in accordance with embodiments.

Figure 2D:
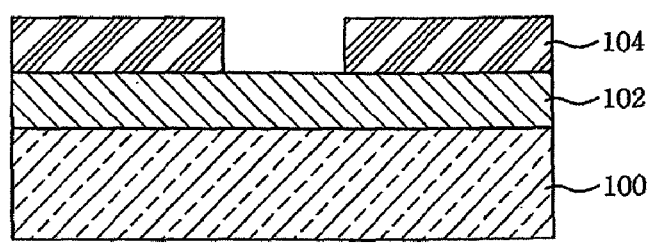

As illustrated in example FIG. 2D, exposed protective film 104 may be etched using the pad opening pattern 106 as a mask to open the pad 102, in accordance with embodiments. Pad opening pattern 106 may then be removed. Protective film 104 on the pad 102 may be etched using a $C_xF_y$-based gas, in accordance with embodiments. However, an organic polymer containing C and F groups from the $C_xF_y$-based gas may inadvertently remain on the surface of pad 102, which may react with moisture ($H_2O$) in a subsequent process. This reaction may cause corrosion of pad 102. The organic material containing C and F groups may exists in the form of $Al(OF)_x$ or $AlF_x$.

Figure 2E:
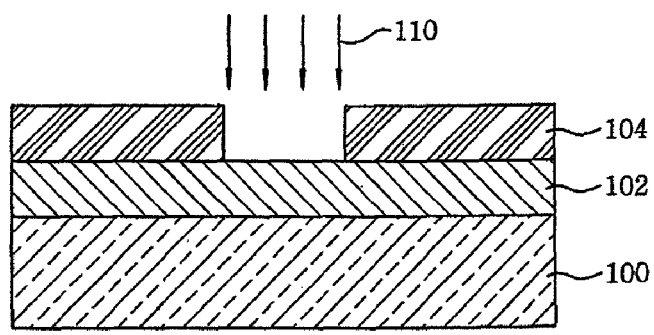

As illustrated in example FIG. 2E, dielectric heating 110 may be performed on pad 102 (in the opening of protective film 104) to remove residues after etching, in accordance with embodiments. In embodiments, an organic polymer containing C and F groups in the form of $Al(OF)_x$ of $AlF_x$ may be removed. In embodiments, dielectric heating may be microwave dielectric heating. For example, microwave dielectric heating may use microwaves having a frequency in a range between approximately 915±25 MHz and/or approximately 2,450±25 MHz, in accordance with embodiments. Microwave dielectric heating is the phenomenon in which a dipole is generated in a dielectric and rotated by a high-frequency electric field. Heat may be generated by friction between molecules. Accordingly, the microwave dielectric heating may be directly applied to the molecules of a residual organic material containing C and F groups after etching, in accordance with embodiments. In embodiments, dielectric heating may heat and resolve the organic material, such that the organic material is removed in the form of $CO_2$, $H_2O$, HF, and/or $C_xF_y$ gas. In embodiments, microwave dielectric heating may have a relatively high heating efficiency on an organic material having carbon atoms having a relatively high dielectric constant. Therefore, the organic polymer containing C and F groups may be resolved, resulting in an organic polymer being efficiently removed. Accordingly, in embodiments, it may be possible to substantially prevent and/or minimize a pad from corroding.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   forming a protective film over a pad;
   opening the pad by etching the protective film using a pad opening pattern as a mask; and
   dielectric heating the opened pad.

2. The method of claim 1, wherein the dielectric heating uses microwaves.

3. The method of claim 2, wherein the microwaves have a frequency in a range of approximately 890 MHz to approximately 930 MHz.

4. The method of claim 2, wherein the microwaves have a frequency in a range of approximately 2425 MHz to approximately 2475 MHz.

5. The method of claim 1, wherein:
   the dielectric heating is directly applied to the molecules of a residual organic material containing C and F groups after etching; and
   the dielectric heating heats and resolves the organic material, such that the organic material are removed in the form of at least one of $CO_2$, $H_2O$, HF, and $C_xF_y$ gas.

6. The method of claim 1, wherein the pad comprises aluminum (Al).

7. The method of claim 1, wherein the protective film comprises at least one of silicon nitride (SiN), silicon oxide ($SiO_2$), and silicon oxynitride (SiON).

8. The method of claim 1, wherein the protective film comprises a single layer.

9. The method of claim 1, wherein the protective film comprises multiple layers.

10. The method of claim 1, wherein the protective film is etched using a $C_xF_y$-based gas.

11. An apparatus comprising a protective film formed over a pad, wherein the pad is opened by etching the protective film using a pad opening pattern as a mask and dielectric heating the opened pad.

12. The apparatus of claim 11, wherein the dielectric heating uses microwaves.

13. The apparatus of claim 12, wherein the microwaves have a frequency in a range of approximately 890 MHz to approximately 930 MHz.

14. The apparatus of claim 12, wherein the microwaves have a frequency in a range of approximately 2425 MHz to approximately 2475 MHz.

15. The apparatus of claim 11, wherein:
   the dielectric heating is directly applied to the molecules of a residual organic material containing C and F groups after etching; and
   the dielectric heating heats and resolves the organic material, such that the organic material are removed in the form of at least one of $CO_2$, $H_2O$, HF, and $C_xF_y$ gas.

16. The apparatus of claim 11, wherein the pad comprises aluminum (Al).

17. The apparatus of claim 11, wherein the protective film comprises at least one of silicon nitride (SiN), silicon oxide ($SiO_2$), and silicon oxynitride (SiON).

18. The apparatus of claim 11, wherein the protective film comprises a single layer.

19. The apparatus of claim 11, wherein the protective film comprises multiple layers.

20. The apparatus of claim 11, wherein the protective film is etched using a $C_xF_y$-based gas.

* * * * *